United States Patent
Perner et al.

(10) Patent No.: US 7,102,920 B2
(45) Date of Patent: Sep. 5, 2006

(54) SOFT-REFERENCE THREE CONDUCTOR MAGNETIC MEMORY STORAGE DEVICE

(75) Inventors: Frederick A. Perner, Palo Alto, CA (US); Kenneth K. Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 183 days.

(21) Appl. No.: 10/806,709

(22) Filed: Mar. 23, 2004

(65) Prior Publication Data

US 2005/0213375 A1    Sep. 29, 2005

(51) Int. Cl.
*G11C 11/14*    (2006.01)
(52) U.S. Cl. ...................................... 365/171
(58) Field of Classification Search .............. None
See application file for complete search history.

(56) References Cited

U.S. PATENT DOCUMENTS

| | | | |
|---|---|---|---|
| 6,072,718 A * | 6/2000 | Abraham et al. | 365/173 |
| 6,188,615 B1 | 2/2001 | Perner et al. | |
| 6,191,577 B1 | 2/2001 | Sasaki et al. | |
| 6,248,416 B1 | 6/2001 | Lambeth et al. | |
| 6,358,757 B1 | 3/2002 | Anthony | |
| 6,385,082 B1 | 5/2002 | Abraham et al. | |
| 6,404,674 B1 | 6/2002 | Anthony et al. | |
| 6,498,092 B1 | 12/2002 | Lee et al. | |
| 6,538,297 B1 * | 3/2003 | Odagawa et al. | 257/421 |
| 6,538,917 B1 | 3/2003 | Tran et al. | |
| 6,538,920 B1 | 3/2003 | Sharma et al. | |
| 6,707,084 B1 * | 3/2004 | Katti et al. | 257/295 |
| 2002/0067645 A1 * | 6/2002 | Ohmori et al. | 365/200 |
| 2003/0057461 A1 | 3/2003 | Tran et al. | |
| 2003/0111626 A1 | 6/2003 | Hosotani | |
| 2003/0169620 A1 | 9/2003 | Sharma et al. | |
| 2004/0170054 A1 | 9/2004 | Mattheis et al. | |
| 2005/0174836 A1 | 8/2005 | Sharma et al. | |

FOREIGN PATENT DOCUMENTS

| | | |
|---|---|---|
| EP | 1 061 592 | 12/2000 |
| EP | 1061592 | 12/2000 |

OTHER PUBLICATIONS

A.E. Berkowitz et al. "Exchange Anisotropy—A Review", Journal of Magnetizm and Magnetic Materials 200(1999) 552-570 (Mar. 12, 1999).

J. Nogues, Ivan K. Schuller "Exchange Bias", Journal of Magnetizm and Magnetic Materials 192(1999) 203-232 (Mar. 5, 1998).

* cited by examiner

*Primary Examiner*—Thong Q. Le

(57) ABSTRACT

A soft-reference three conductor magnetic memory storage device is disclosed. In a particular embodiment, there are a plurality of parallel electrically conductive first sense/write conductors and a plurality of parallel electrically conductive second sense conductors. The first sense/write and second sense conductors may provide a cross point array. Soft-reference magnetic memory cells are provided in electrical contact with and located at each intersection. In addition there are a plurality of parallel electrically conductive third write column conductors substantially proximate to and electrically isolated from the second sense conductors. Sense magnetic fields orient the soft-reference layer but do not alter the data stored within the cell. An associated method of use is also provided.

20 Claims, 7 Drawing Sheets

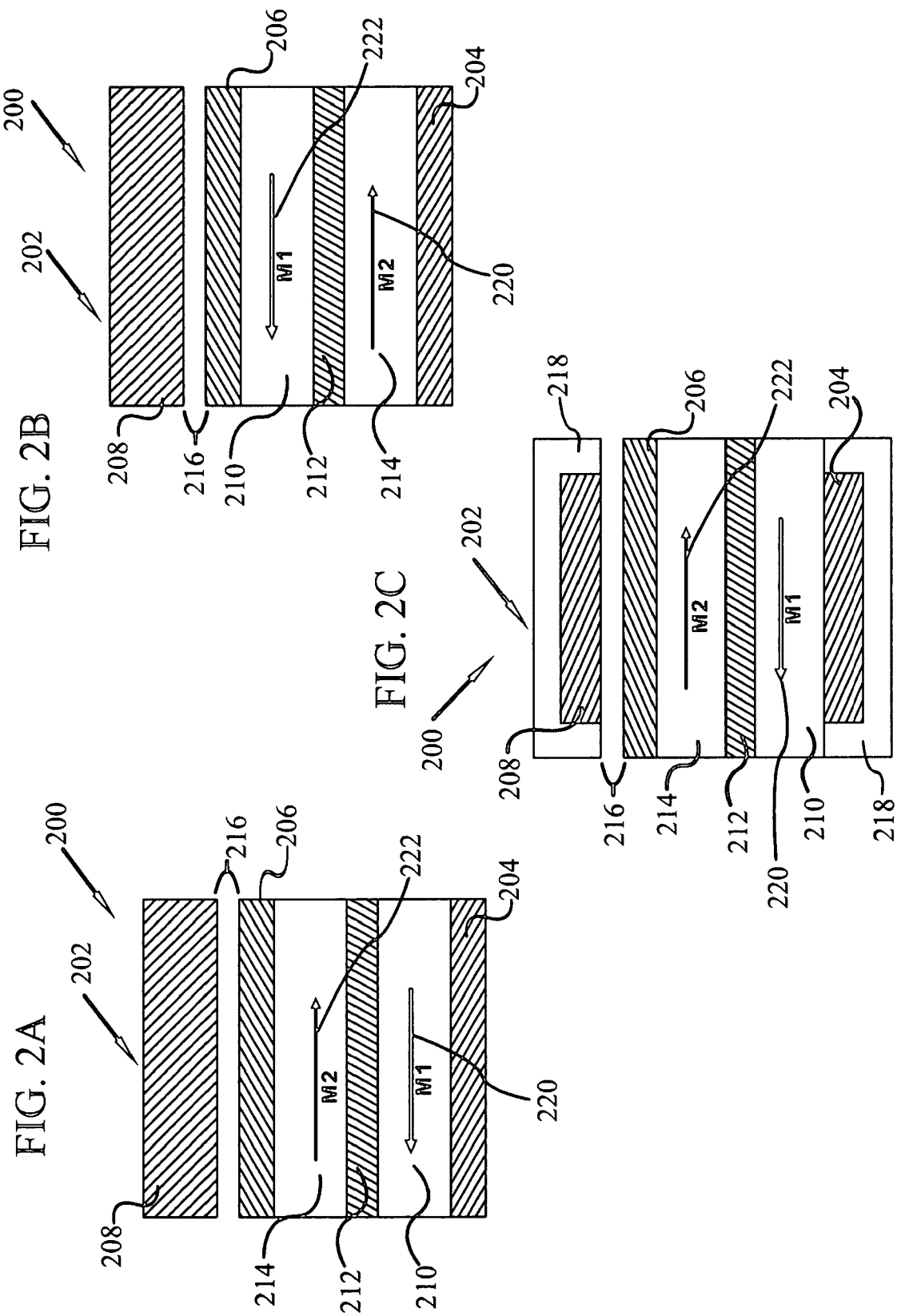

SOFT-REFERENCE THREE CONDUCTOR MAGNETIC MEMORY STORAGE DEVICE

FIELD OF THE INVENTION

This invention relates generally to magnetic memory devices and in particular to soft-reference layer magnetic random access memory (commonly referred to as "MRAM") in a three conductor architecture.

BACKGROUND

Today's computer systems are becoming increasingly sophisticated, permitting users to perform an ever increasing variety of computing tasks at faster and faster rates. The size of the memory and the speed at which it can be accessed bear heavily upon the overall speed of the computer system.

Generally, the principle underlying the storage of data in magnetic media (main or mass storage) is the ability to change and/or reverse the relative orientation of the magnetization of a storage data bit (i.e. the logic state of a "0" or a "1"). The coercivity of a material is the level of demagnetizing force that must be applied to a magnetic particle to reduce and/or reverse the magnetization of the particle. Generally speaking, the smaller the magnetic particle, the higher its coercivity.

A prior art magnetic memory cell may be a tunneling magneto-resistance memory cell (TMR), a giant magneto-resistance memory cell (GMR), or a colossal magneto-resistance memory cell (CMR). These types of magnetic memory are commonly referred to as spin valve memory cells (SVM). FIGS. 1A and 1B provide a perspective view of a typical prior art magnetic memory cell having two conductors.

As shown in prior art FIGS. 1A and 1B, a magnetic spin valve memory (SVM) cell 101 generally includes a data layer 103 which may alternatively be called a storage layer or bit layer, a reference layer 105, and an intermediate layer 107 between the data layer 103 and the reference layer 105. The data layer 103, the reference layer 105, and the intermediate layer 107 can be made from one or more layers of material. Electrical current and magnetic fields may be provided to the SVM cell 101 by an electrically conductive row conductor 109 and an electrically conductive column conductor 111. It is understood and appreciated that, as used herein, the terms row and column conductor have been selected for ease of discussion. Under appropriate circumstances these labels may be reversed and/or otherwise substituted for such titles as word line and bit line.

The single SVM cell shown in FIGS. 1A and 1B are typically combined with other substantially identical SVM cells. In a typical MRAM device, the SVM cells are arranged in a cross-point array. Parallel conductive columns (column 1, 2, 3 . . . ), also referred to as word lines, cross parallel conductive rows (row A, B, C . . . ), also referred to as bit lines. The traditional principles of column and row arrays dictate that any given row will only cross any given column once.

An SVM cell is placed at each intersecting cross-point between a row and a column. By selecting a particular row (B) and a particular column (3), any one memory cell positioned at their intersection (B, 3) can be isolated from any other memory cell in the array. Such individual indexing is not without complexities.

The data layer 103 is usually a layer of magnetic material that stores a bit of data as an orientation of magnetization M1 that may be altered in response to the application of an external magnetic field or fields. More specifically, the orientation of magnetization M1 of the data layer 103 representing the logic state can be rotated (switched) from a first orientation, 117 in FIG. 1A, representing a logic state of "0", to a second orientation, 119 in FIG. 1B representing a logic state of "1", and/or vice versa.

The reference layer 105 is usually a layer of magnetic material in which an orientation of magnetization M2 is "pinned", as in fixed, in a predetermined direction, 121. The direction is predetermined and established by conventional microelectronic processing steps employed in the fabrication of the magnetic memory cell.

The data layer 103 and reference layer 105 may be thought of as stacked bar magnets, each long on an X axis 113 and short on a Y axis 115. The magnetization of each layer has a strong preference to align along the easy axis, generally the long X axis 113. The short Y axis 115 is generally the hard axis. As with traditional bar magnets, the data layer and reference layer each have magnetic dipoles—North (N) and South (S)—one at either end of the easy axis. The lines of magnetic force that surround the data layer and reference layers are three-dimensional and flow from the North to the South pole.

Typically, the logic state (a "0" or a "1") of a magnetic memory cell depends on the relative orientations of magnetization M1 in the data layer 103 and M2 of the reference layer 105, 117 to 121 as shown in FIG. 1A or 119 to 121 as shown in FIG. 1B. For example, when an electrical potential bias is applied across the data layer 103 and the reference layer 105 in an SVM cell 101, electrons migrate between the data layer 103 and the reference layer 105 through the intermediate layer 107. The intermediate layer 107 is typically a thin dielectric layer, which is commonly referred to as a tunnel barrier layer. The phenomenon that cause the migration of electrons through the barrier layer may be referred to as quantum mechanical tunneling or spin tunneling.

The logic state may be determined by measuring the resistance of the SVM cell 101. For example, if the orientation 119 of the magnetization M1 in the data layer 103 is parallel to the pinned orientation 121 of magnetization in the reference layer 105 the magnetic memory cell will be in a state of low resistance, R, see FIG. 1B. If the orientation 117 of the magnetization M1 in the data layer 103 is anti-parallel (opposite) to the pinned orientation 121 of magnetization in the reference layer 105, the magnetic memory cell will be in a state of high resistance, R+?R, see FIG. 1A. The orientation of M1 and, therefore, the logic state of the SVM cell 101 may be read by sensing the resistance of the SVM cell 101.

In an ideal setting, the orientation 117, 119 of the alterable magnetic field M1 in the data layer 103 is be either parallel or anti-parallel with respect to the set orientation 121 of magnetic field M2 of the reference layer 105. It is problematic that as both the data layer 103 and the reference layer 105 are generally made from ferromagnetic materials and are positioned in close permanent proximity to each other The pinned reference layer 105 may affect the orientation of the data layer 103. More specifically, the magnetization M2 of the reference layer 105 may generate a demagnetization field that extends from the reference layer 105 into the data layer 103.

The result of this demagnetization field from the reference layer 105 is an offset in the coercive switching field. This offset can result in asymmetry in the switching characteristics of the data layer 103 and the amount of switching field needed to switch the bit from parallel to anti-parallel state differs from the amount of switching field needed to switch the bit from anti-parallel state to parallel state. To achieve reliable switching characteristics and to simplify the read/write circuitry, it is desirable to reduce this offset to as near zero as possible.

The magneto-resistance ?R/R ratio is analogous to a signal-to-noise ratio S/N in that a higher S/N or magneto-resistance ratio results in a stronger signal that can be sensed to determine the state of the bit in the data layer. Thus, at least one disadvantage of a tunnel junction memory cell having a pinned reference layer in close and fixed proximity to the data layer is a potential reduction in the magneto-resistance ?R/R resulting from the angular displacement.

The pinned nature of the pinned reference layer is typically established with the use of anti-ferromagnetic (AFM) material in direct physical contact with a ferromagnetic (FM) material. AFM materials magnetically order below their Neel temperatures ($T_N$), the temperature at which they become anti-ferromagnetic or anti-ferrimagnetic. The Neel temperature of AFM materials is analogous to the Curie Temperature ($T_C$) of FM materials, the temperature above which a FM loses its ability to possess an ordered magnetic state in the absence of an external magnetic field. Generally $T_C$ of the FM is greater than $T_N$ of the AFM.

With respect to a traditional bar magnet there are two equally stable easy spin directions (each rotated 180 degrees) along the easy axis, generally the longer axis of the magnet—the shorter axis being the hard axis. Alignment in either direction requires the same energy and requires the same external field to align the spin of the atomic particles and thus the magnetic field, in either direction.

In establishing a reliable pinned field, it is desirable to establish a preferred orientation along one direction of an axis, typically the easy axis although in some situations it may be the hard axis. By growing the FM on an AFM in a magnetic field H or annealing in field H at a temperature above the Neel temperature of the AFM, the hysteresis loop (FM+AFM+H) becomes asymmetric and is shifted. In general, this shift is significantly greater than H, on the order of a couple hundred Oe. This unidirectional shift is called the exchange bias and demonstrates that there is now a preferred easy axis alignment direction.

The annealing step typically takes time, perhaps an hour or more. In the annealing step the reference layer is heated to a temperature greater than $T_N$ while a magnetic field is applied. As the reference layer is but one part of the memory being produced, the entire memory is typically subjected to temperatures ranging from about 200 to 300 degrees. As the temperature is lowered through $T_N$, the spin of the AFM molecules at the interface between the AFM and FM layers will order and couple to the aligned FM spin. Such ordering of the AFM exerts a torque upon the FM material and results in establishing the pinned orientation of the reference layer.

As a result of such manufacturing stress, the reference layer may un-pin and lose its set orientation if the memory is later subjected to high temperatures. In addition, the characteristics of the data layer may be unknowingly affected by heat during some manufacturing processes.

The traditional process of reading the stored bit is somewhat undesirable, although effective. In general, the row conductor 109 and column conductor 111 for a given SVM cell 101 are selected by appropriate control logic. The control logic is generally further responsible for applying a sense current through the selected column conductor 111 and row conductor 109, measuring the resistance of the current through the SVM cell 101, and recording the measured resistance value. Next, a larger write current is applied to put the data layer 103 into a known orientation. Then, a sense current is re-applied and the resistance of the SVM cell 101 is measured again.

The value determined from a known orientation (the second sense) is then compared with the value from the initial condition (the first sense). The values will either be the same or different, permitting a determination of the data value. If necessary, such as where the initial position is determined to be opposite to the known orientation, a write back can be performed to restore the original initial value. This process is a self reference process and is known as double sampling—the first sample being the initial read and the second being after the known orientation write.

Multiple variations of self reference sampling may be performed with double sampling; however, the underlying negative aspect remains unchanged, namely, to determine the value stored in the data layer 103, it is necessary to change the value in the data layer 103. This change for the purpose of sensing introduces a significant element of risk in data corruption should an error occur during the repetitive sense and write operations.

As a traditional sense operation involves the re-writing the data layer 103 of the SVM cell 101, the physical design of the SVM cell 101 is typically dictated by the stresses imposed by the write process, as both the sense and write operations are performed using the same row and column conductors 109 and 111. As the write magnetic field is typically generated by current applied to the row and column conductors 109 and 111, which are in electrical contact with the SVM cell 101, it is desirable for the SVM cell 101 to be robust enough to withstand the applied current. Design and manufacturing issues are therefore generally focused upon the requirements imposed by the write operation, such as greater electrical current and magnetic fields, higher applied voltages, more robust characteristics in the power supply, row and column conductors 109 and 111 and appropriate buffering spaces.

With respect to magnetic memory components, it is well known that as size decreases, coercivity increases. A large coercivity is generally undesirable, as it must be switched using a greater magnetic field. In turn, a greater magnetic field requires a greater power source and may require larger switching transistors and conductors. Providing large power sources and large switching transistors is generally at odds with industry requirements to reduce the size of nano-scaled components.

In addition, to mitigate the possibility of inadvertently switching a neighboring memory cell, nanometer scaled memory cells are generally more widely spaced relative to their overall size than are larger, non-nanometer sized memory cells. Moreover, as the size of the magnetic memory decreases, the unused buffering space between individual memory cells tends to increase. Eliminating this buffering space, or otherwise reducing its ratio, may provide a greater volume of storage in the same physical space.

These issues of read vs. write currents, robustness of conductors and power supplies, reduction in size increasing coercivity and resulting in a correspondingly greater magnetic field, and current design of the magnetic memory cells also carry over into the design and use of magnetic field sensors. Magnetic field sensors are commonly used in hard drive read cells and read heads. In such implementation, the data layer 103 is termed a sense layer. Whereas the orientation M1 of a data layer in an MRAM cell is generally established by a magnetic field provided by the row and column conductors, the orientation M1 of a sense layer in a read head is generally established by a magnetic field emanating from a storage bit proximate to the read head.

Hence, there is a need for an ultra-high density magnetic memory which overcomes one or more of the drawbacks identified above.

SUMMARY

The present disclosure advances the art and overcomes problems articulated above by providing a soft-reference three-conductor magnetic memory storage device.

In particular, and by way of example only, according to an embodiment a soft-reference three conductor magnetic memory storage device includes: an electrically conductive first sense/write conductor; an electrically conductive second sense conductor; a soft-reference SVM cell in electrical contact with and located between the first sense/write conductor and the second sense conductor, the memory cell including a material with an alterable orientation of magnetization; and an electrically conductive third write column conductor substantially proximate to and electrically isolated from the second sense conductor.

In yet another embodiment, provided is a method of self referenced, non-destructively determining a data value in a magnetic memory storage device having a plurality of soft-reference layer three conductor SVM cells, each cell including at least one data layer and at least one soft-reference layer, the method including: selecting a given SVM cell in electrical contact with a given first sense/write conductor, a given second sense conductor, and substantially proximate to and electrically isolated from a third write column conductor; providing an initial field current to the third write column conductor; the initial current generating an initial sense magnetic field proximate to the given SVM cell; pinning-on-the-fly the soft-reference layer of the given SVM cell in orientation with the initial sense magnetic field; providing an initial sense current by the given first sense/write conductor and second sense conductor through the given SVM cell; measuring an initial resistance value of the given SVM cell; storing the initial resistance value; providing a second known field current to the third write column conductor, the second known current generating an second known sense magnetic field orienting the soft-reference layer in a second known orientation; providing a second sense current by the given first sense/write conductor and second sense conductor through the given SVM cell; storing the second resistance value as a reference resistance; comparing the initial resistance value to the reference resistance value; and returning a logic level associated with the compared state.

BRIEF DESCRIPTION OF THE DRAWINGS

FIG. 2A provides a plain view of a soft-reference three conductor magnetic memory according to one embodiment;

FIG. 2B provides a plain view of a soft-reference three conductor magnetic memory according to an alternative embodiment;

FIG. 2C provides a plain view of a soft-reference three conductor magnetic memory according to yet another alternative embodiment;

DETAILED DESCRIPTION

Figure 1A:
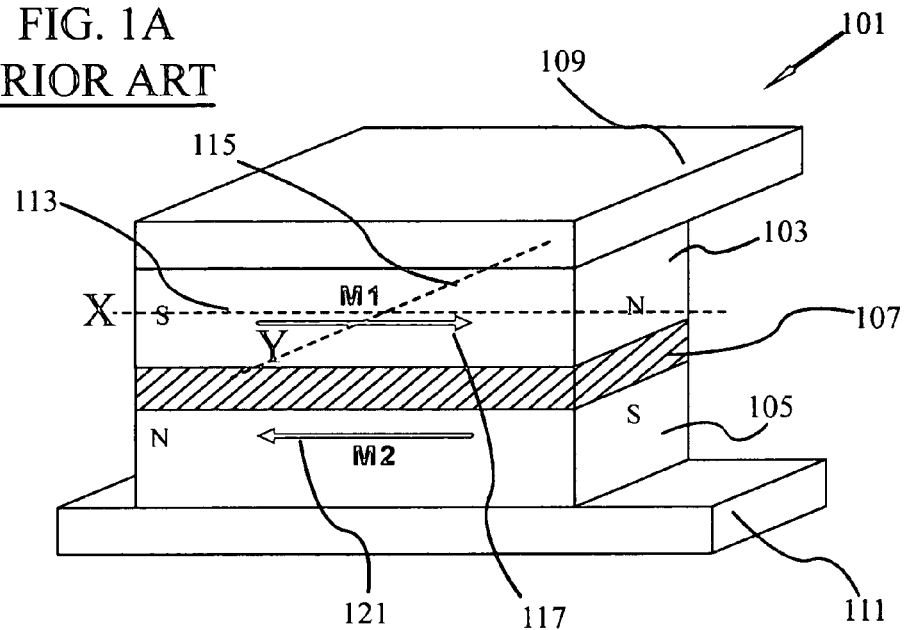
FIGS. 1A~1B show perspective views of a prior art magnetic memory cell having two conductors.
Figure 1B:
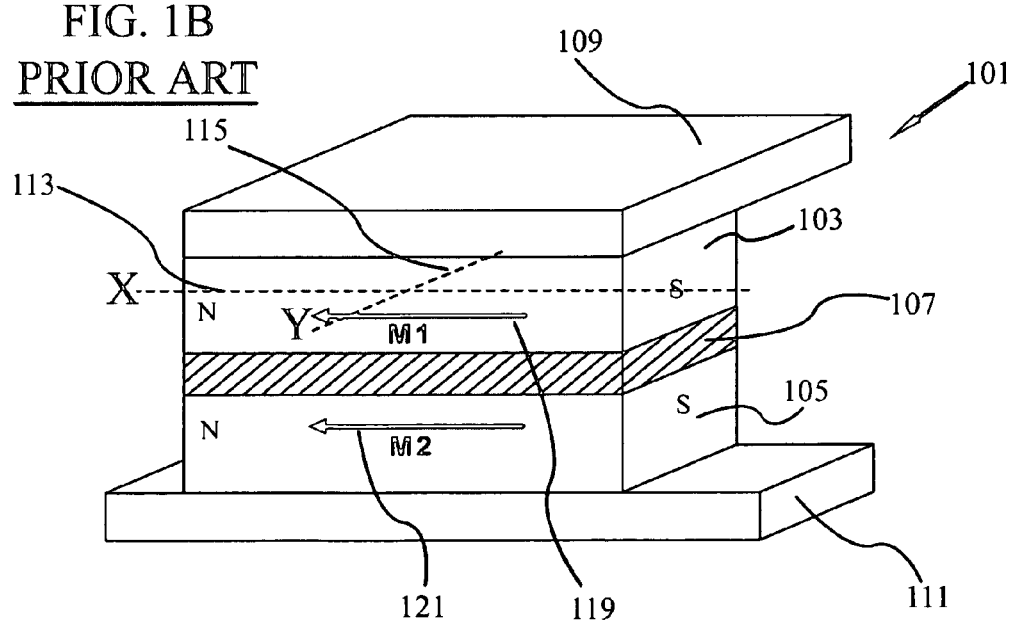

Before proceeding with the detailed description, it is to be appreciated that the present teaching is by way of example, not limitation. The concepts herein are not limited to use or application with a specific type of magnetic memory. Thus, although the instrumentalities described herein are for the convenience of explanation, shown and described with respect to exemplary embodiments, it will be appreciated that the principals herein may be equally applied in other types of magnetic memory.

Referring now to the drawings, and more particularly to FIG. 2A, there is shown a portion of a soft-reference three-conductor magnetic memory 200 having at least one soft-reference spin valve magnetic memory (SVM) cell 202. In at least one embodiment, the memory cell 202 is a soft-reference SVM cell 202 having an electrically conductive first sense/write conductor 204, an electrically conductive second sense conductor 206 and an electrically conductive third write column conductor 208.

The soft-reference SVM cell 202 has a ferromagnetic data layer 210, an intermediate layer 212 and a ferromagnetic soft-reference layer 214. The ferromagnetic data layer 210 permits the storing of a bit of data as an alterable orientation of magnetization M1 220. The intermediate layer 212 has opposing sides such that the data layer 210 in contact with one side is in direct alignment with, and substantially uniformly spaced from, the soft-reference layer 214, in contact with the second side of the intermediate layer 212. The soft-reference layer 214 is characterized by a non-pinned orientation of magnetization M2 222 and a lower coercivity than the data layer 210.

The data layer 210 is typically established with the use of a ferromagnetic (FM) material layer. Unlike a pinned reference layer, the FM layer is generally not provided in contact with an anti-ferromagnetic (AFM) layer as it is generally not necessary to establish a magnetic exchange bias. The hysteresis loop of the data layer 210 is substantially symmetric, indicating two substantially equivalent easy directions for magnetic alignment.

The magnetic orientation M1 220 of the data layer 210 can be oriented in a chosen direction along generally the easy axis when an appropriate magnetic field is applied, and remain in that orientation when the field is removed. More specifically the orientation M1 220 is set by applying a magnetic field that overcomes the coercivity of the data layer 210, Hc(data). In short, the magnetic orientation M1 220 of the data layer 210 is alterable, but will be maintained in the last state of orientation.

In contrast to the prior art pinned reference layer, a soft-reference layer 214 is established by providing a FM layer that is not in direct contact with an AFM layer. The coercivity of the soft-reference layer 214, Hc(sref), is substantially minimal. Moreover, in the presence of a magnetic field with a magnitude greater than Hc(ref), the coercivity of the soft-reference layer 214 will be overcome and the orientation M2 222 of the soft-reference layer 214 will align to the field. The soft-reference layer 214 is therefore similar to the data layer 210 in having the ability to orient in the presence of a magnetic field.

The ferromagnetic data layer 210 and the soft-reference layer 214 may be made from a material that includes, for example: Nickel Iron (NiFe), Nickel Iron Cobalt (NiFeCo), Cobalt Iron (CoFe), and alloys of such metals. In at least one embodiment, the data layer 210 and soft-reference layer 214 are made from NiFe. One difference between the data layer 210 and the soft-reference layer 214 is that the coercivity of the soft-reference layer 214, Hc(sref) is less than the coercivity of the data layer 210, Hc(data). As such, the orientation M 222 of the soft-reference layer 214 may be oriented/re-oriented without disrupting the orientation M1 220 of the data layer 210. The difference in coercivity may be achieved by both shape, thickness, or composition of the data layer 210 and soft-reference layer 214.

In addition, both the soft-reference layer 214 and the data layer 210 may be formed from multiple layers of materials. Such formation from multiple layers may be desired, for example, to provide a more uniform magnetic structure than may be achieved by applying either a very thick or very thin layer of FM material. However, for conceptual simplicity and ease of discussion, each layer component is herein discussed as a single layer.

As illustrated, in FIGS. 2A, 2B and 2C the third write column conductor 208 is substantially proximate to and electrically isolated from the second sense conductor 206. In at least one embodiment, this electrical isolation may be accomplished by physical spacing 216. Under appropriate circumstances, such isolation may be achieved with the use of a material such as a dielectric. In at least one embodiment this isolation is achieved with a dielectric between the third write column 208 and the second sense conductor 206. More specifically, the third write column conductor 208 is not in electrical contact with the SVM cell 202.

The SVM cell 202 is located between and in electrical contact with the first sense/write conductor 204 and the second sense conductor 206. More specifically, in at least one embodiment the first sense/write conductor 204 is in electrical contact with the data layer 210, opposite from the intermediate layer 212. Likewise, the second sense conductor 206 is in electrical contact with the soft-reference layer 214, opposite from the intermediate layer 212.

In at least one alternative embodiment, this relationship is flipped. More specifically and as shown in FIG. 2B, the first sense/write conductor 204 is in electrical contact with the soft-reference layer 214 and the second sense conductor 206 is in electrical contact with the data layer 210.

In yet another embodiment, as shown in FIG. 2C, under appropriate circumstances the third write column conductor 208 and/or the first sense/write conductor 204 may be at least partially coated with ferromagnetic cladding 218 so as to concentrate the magnetic field in the data layer and minimize the spread of sense and write magnetic fields.

Figure 3:
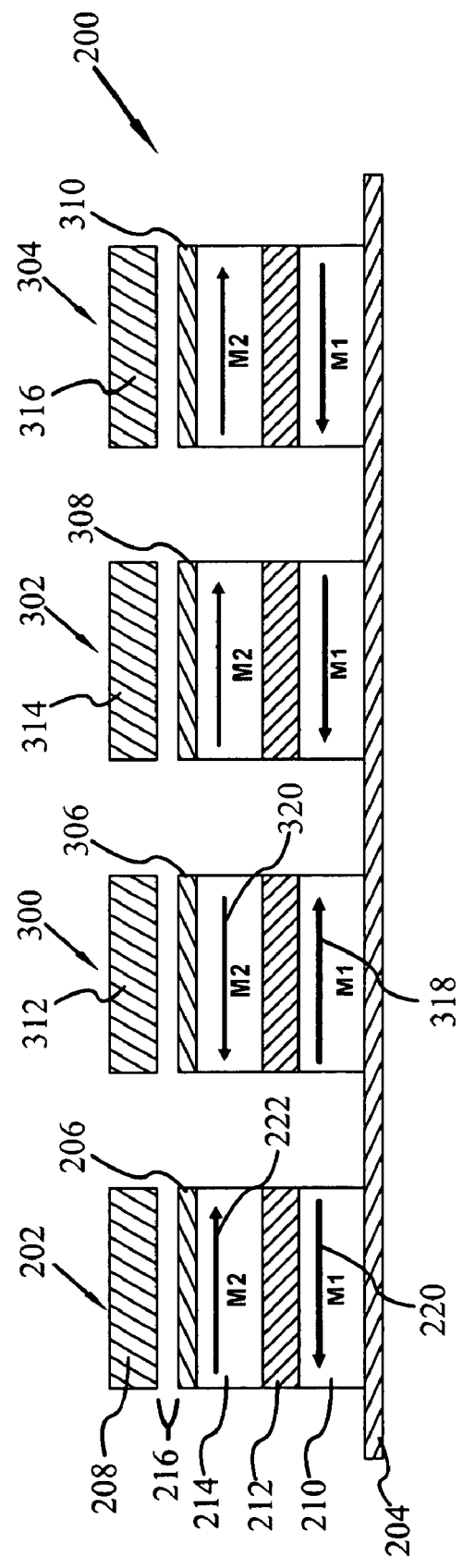
FIG. 3 provides plain views of the memory according to FIG. 2A.

FIG. 3 conceptually illustrates a larger portion of the magnetic memory 200 wherein the plurality of SVM cells 202, 300, 302, and 304 are arranged in a cross-point array (see FIG. 4). As shown, the cross-point array 400 includes a plurality of parallel electrically conductive first sense/write conductors 204 and 204' (see FIG. 4 for 204'). A plurality of electrically conductive second sense conductors 206, 306, 308, and 310 cross the first sense/write conductors 204 and 204', thereby forming a cross-point array with a plurality of intersections.

In at least one embodiment, first sense/write conductors (204, 204') are transverse to the second sense conductors (206, 306, 308, 310). The first sense/write conductors (204, 204') may be described as conductive rows or conductive word lines. The second sense conductors (206, 306, 308, 400) may be described as conductive columns or conductive bit lines.

A plurality of soft-reference SVM cells 202, 300, 302, and 304 are also provided. Respectively, each cell is in electrical contact with, and located at, an intersection between a given first sense/write conductor and a given second sense conductor. Moreover, the placement of each soft-reference SVM cell 202, 300, 302, and 304 is substantially in alignment with the intersections of the cross-point array 400.

A plurality of electrically conductive third write column conductors 208, 312, 314, and 316 are located substantially proximate to and electrically isolated from the second sense conductors 206, 306, 308, and 310. As shown, in at least one embodiment the electrically conductive third write column conductors 208, 312, 314 and 316 are substantially parallel to and in alignment with the second sense conductors 206, 306, 308, and 310.

Figure 4A:
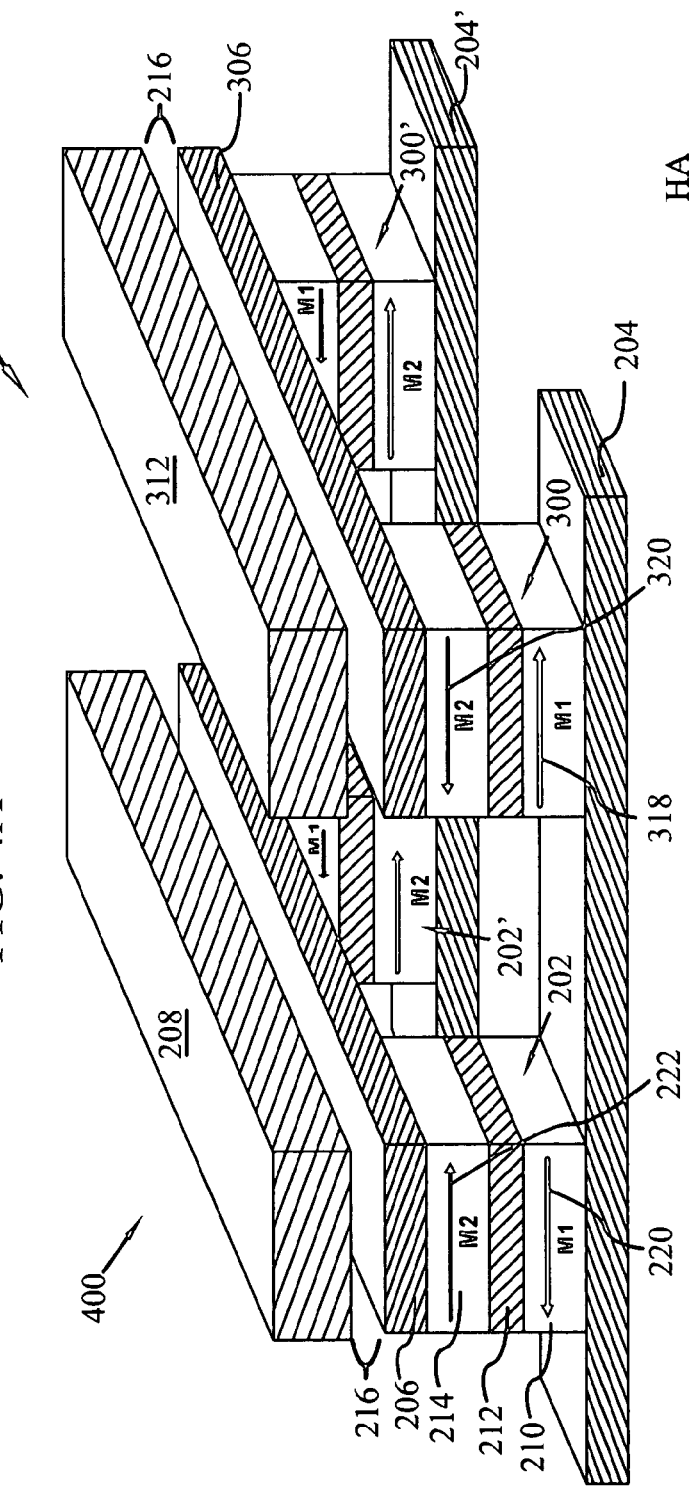
FIG. 4A is a partial perspective view of the cross-point array of the memory of FIG. 3A.

FIG. 4A provides a perspective view of the cross-point array architecture illustrated in FIG. 3. The component structures of SVM cells 300, 300' and 202' parallel those of SVM cell 202 as described above and illustrated in FIGS. 2~3. As shown, the third write column conductors 208 and 312 are substantially parallel to one another, and to the second sense conductors 206 and 306. The electrical isolation of the write conductors 208 and 312 may also be more fully appreciated. Illustrated as physical space 216 isolation, under appropriate circumstances this electrical isolation may also be achieved with the use of a dielectric or other material which provides electrical isolation while permitting magnetic interaction.

The behavior and properties of SVM memory cells are generally well understood. Three types of SVM cells in particular are known—a tunneling magneto-resistance memory cell (TMR), a giant magneto-resistance memory cell (GMR) and colossal magneto-resistance memory cell (CMR). GMR and CMR memory cells have similar magnetic behavior but their magneto-resistance arises from different physical effects as the electrical conduction mechanisms are different. More specifically, in a TMR-based memory cell, the phenomenon is referred to as quantum-mechanical tunneling or spin-dependent tunneling. In a TMR memory cell, the intermediate layer 212 is a thin barrier of dielectric material through which electrons quantum mechanically tunnel between the data layer 210 and the soft-reference layer 214.

In a GMR memory cell, the intermediate layer 212 is a thin spacer layer of non-magnetic but conducting material. Here the conduction is a spin-dependent scattering of electrons passing between the data layer 210 and the soft-reference layer 214 though the intermediate layer 212. In either case, the resistance between the data layer 210 and the soft-reference layer 214 will increase or decrease depending on the relative orientations of the magnetic fields M1 220 and M2 222. It is that difference in resistance that is sensed to determine if the data layer 210 is storing a logic state of "0" or a logic state of "1".

In at least one embodiment, the SVM cell 202 is a TMR cell wherein the intermediate layer 212 is a tunnel layer made from an electrically insulating material (a dielectric) that separates and electrically isolates the data layer 210 from the soft-reference layer 214. Suitable dielectric materials for the dielectric intermediate layer 212 may include, but are not limited to: Silicon Oxide (SiO$_2$), Magnesium Oxide (MgO), Silicon Nitride (SiN$_x$), Aluminum Oxide (Al$_2$O$_3$), Aluminum Nitride (AlN$_x$), and Tantalum Oxide (TaO$_x$). In at least one embodiment, the intermediate layer 212 is Silicon Oxide.

In at least one other embodiment, the SVM cell 202 is a GMR or CMR cell wherein the intermediate layer 212 is made from a non-magnetic material such as a 3d, a 4d, or a 5d transition metal listed in the periodic table of the elements. Suitable non-magnetic materials for a non-magnetic intermediate layer 212 may include, but are not limited to: Copper (Cu), Gold (Au) and Silver (Ag). In at least one embodiment, the intermediate layer 212 is Copper.

While the actual thickness of the intermediate layer 212 is dependent upon the materials selected to create the intermediate layer 212 and the type of tunnel memory cell desired, in general, the intermediate layer 212 has a thickness of about 0.5 nm to about 5.0 nm. However, under appropriate circumstances this thickness may be increased or decreased.

The soft-reference layer 214 shown in FIGS. 2A through 4A is so named because the direction of orientation of magnetization M2 can be dynamically set. Such dynamic setting may be achieved by a magnetic field or fields provided by an externally supplied current flowing through at least one conductor. This dynamic setting may be referred to as pinned-on-the-fly, or even more appropriately, as oriented-on-the-fly, as is used herein.

The use of a soft-reference layer 214 has several advantageous benefits in the SVM cell 202. As a soft-reference layer is not substantially pinned in orientation, it may not be necessary to subject the SVM cell 202 to high temperatures during manufacturing, as is often required to establish a fixed/pinned reference layer. In addition, the lack of a substantial and constant magnetic field in the soft-reference layer 214 reduces the likelihood of a demagnetization field from the soft-reference layer 214 acting upon the data layer 210, thus reducing the offset in the coercive switching field.

Like magnetic dipoles (North-North) repel while opposite magnetic dipoles (North-South) attract. As a result of this natural behavior, the soft-reference layer 214 may be described as having an "at-rest" orientation of M2. When "at rest", the orientation of M2 222 for the soft-reference layer 214 will be anti-parallel to the orientation of M1 220, for whichever direction along the easy axis M1 220 has been set in the data layer 210.

This "at rest" relationship is illustrated in FIG. 3 and FIG. 4A, showing SVM cell 202 with an anti-parallel relationship between M1 220 and M2 222, and SVM cell 300 with an anti-parallel relationship between M1 318 and M2 320. The "at rest" state occurs when the only magnetic field substantially acting upon the soft-reference layer 214 is the magnetic field of the data layer 210. Such an "at rest" condition also exists when the magnitude of a magnetic field proximate to the SVM cell 202 produced when a current is passed through a proximate conductor is substantially zero.

The use of three conductors provides several advantages over the prior art for sensing and writing. The write operation is dependent upon a sufficient magnetic switching field being provided to overcome the coercivity of the data layer 210 and orient its magnetization M1 in a desired direction. This operation is not dependent upon the flow of current through the SVM cell 202.

As the third write column conductors 208 and 312 are electrically isolated from the second sense conductors 206 and 306, and thus by implication electrically insulated from the SVM cells 202, 202', 300, 300', a greater voltage may be applied to the third write column conductors 208 and 312. This greater voltage permits a greater current to be applied through the third write column conductors 208 and 312 than might otherwise be applied to the SVM cells 202, 202', 300, and 300'. The purpose of the current in third write column conductors 208 and 312 is to generate a magnetic switching field. Providing at least one switching field without requiring the SVM cells 202, 202', 300, and 300' to endure the requisite high current reduces the likelihood of fatigue and or failure of the SVM cells 202, 202', 300, and 300'.

Figure 4B:
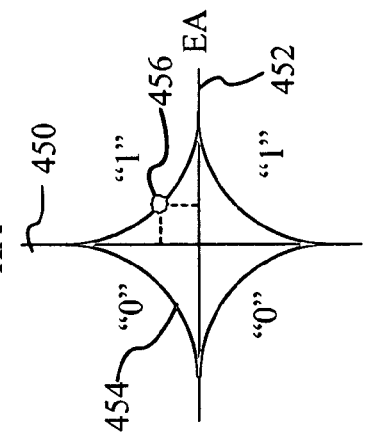
FIG. 4B illustrates the switching model of the memory of FIGS. 2A through 4A.

Further, a magnetic switching field may be applied along either the hard axis, the soft axis or a combination of both. As illustrated in FIG. 4B, combining fields along the hard axis HA 450 and easy axis EA 452, provides a "Stoner-Wohlfarth" asteroid switching model. The combined fields provide a switching field represented as asteroid 454. An individual field or combined field that falls within the asteroid 454 is insufficient to overcome the coercivity of a particle, whereas an individual or combined set of fields falling on or outside the asteroid 454 will overcome the coercivity of the particle. More specifically, point 456 represents a combined field sufficient to overcome the coercivity of a particle and align it to the "1" orientation, at a point where the individual fields would be insufficient on their own.

The third write column conductor 208 provides a write magnetic field to the data layer 210 along the easy axis, which by itself is insufficient to overcome the coercivity of the data layer 210 and orient M1. However, working in tandem with the first sense/write conductor 204 providing an additional write magnetic field along the hard axis, the combined magnetic fields will suffice to overcome the coercivity of the data layer 210. The effect of the combined magnetic field upon the soft-reference layer 214 is of substantially no concern, as the soft-reference orientation M2 is not fixed and will respond again when an appropriate sense field is applied The use of a combined field advantageously reduces the possibility of inadvertent half-select write errors—instances where unintended cells are inadvertently re-oriented as well. In the absence of the additional current from the first sense/write conductor 204, or by utilizing a lower current, the third write column conductor 208 orients the soft-reference layer 214 on-the-fly.

In addition, the use of a soft-reference layer 214 within the three-conductor architecture permits the determination of the data bit stored in the data layer 210 without destructively over-writing and re-writing the data bit. As such, a substantial opportunity for inadvertent data corruption is advantageously avoided.

More specifically, during a read operation the ferromagnetic soft-reference layer 214 is oriented-on-the-fly to a desired orientation by a sense magnetic field generated by at least one sense current flowing in the third write column conductor 208. This generated magnetic field is insufficient to affect the orientation of the data layer 210.

It is to be understood that the arrangements illustrated in FIGS. 2 through 6 have has been provided for the ease of conceptual illustration. Under appropriate circumstances the parallel relationships between the third write column conductor and the second sense conductor may not be employed. In addition, the depiction of the SVM cells, data layers, intermediate layers, soft-reference layers, first sense/write conductors, second sense conductors, and third write column conductors as rectangular structures is not intended to suggest or imply that they will take this form in each embodiment. It is further appreciated that the drawings are not to scale.

Having described the above physical embodiment of the soft-reference three conductor magnetic memory 200, another embodiment relating to the method of use in non-destructively determining the value held in the data layer 210 will now be described with reference to FIGS. 5A–5B and 6A–6B, illustrating a cross-point array, and the Flowchart of FIG. 7. It will be appreciated that the described method need not be performed in the order in which it is herein described, but that this description is merely exemplary of at least one method of using soft-reference three-conductor magnetic memory 200, in accordance with the present instrumentality. Except for the first "2" in the reference numerals used in the Figures above, the remainder of the numerals in FIGS. 5A–6B follow those used in other Figures, to indicate similarity.

Figure 7:
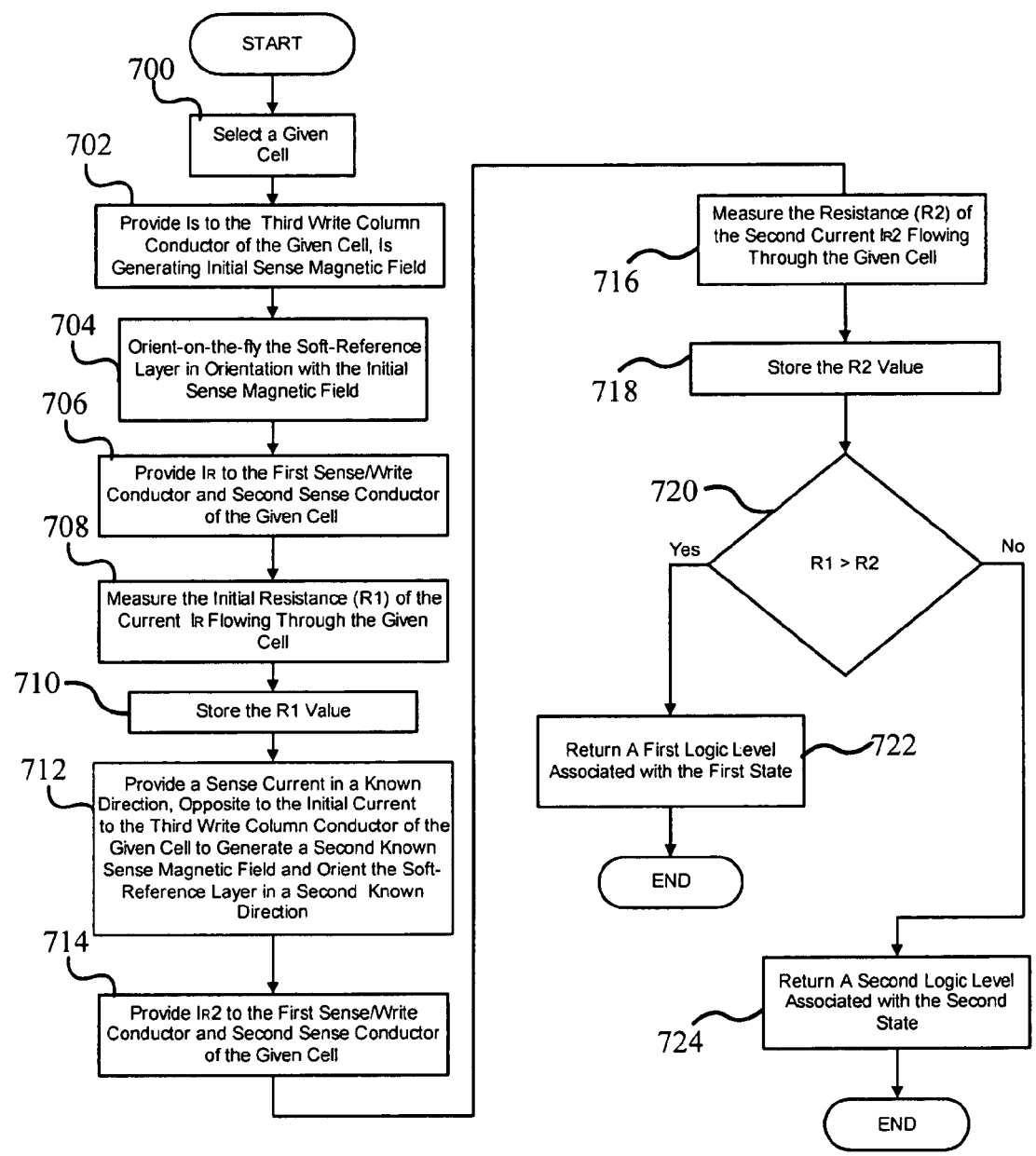
FIG. 7 is a flowchart depicting the steps of non-destructively sensing the data value within the memory according to FIGS. 2A, 5A and 5B.

As indicated in the flowchart of FIG. 7, the selection of a given magnetic memory cell is made in step 700 from a storage device having a plurality of soft-reference three-conductor magnetic memory cells. The selection is accomplished with the appropriate control logic. Such control logic may, for example, include row and column selectors switchably connecting to the appropriate conductors proximate to the selected SVM cell. More specifically, FIGS. 5A and 5B conceptually illustrate the perspective view of a selected SVM cell 502, substantially similar to SVM cell 202, described above.

As shown, SVM cell 502 has at least one ferromagnetic data layer 510, an intermediate layer 512 and a ferromagnetic soft-reference layer 514. The ferromagnetic data layer 510 permits the storing of a bit of data as an alterable orientation of magnetization M1. The intermediate layer 512 has opposing sides such that the data layer 510 in contact with one side is in direct alignment with, and substantially uniformly spaced from, the soft-reference layer 514, in contact with the second side of the intermediate layer 512. The soft-reference layer 514 is characterized by a non-pinned orientation of magnetization M2 and a lower coercivity than the data layer 510.

The perspective cross section as shown illustrates the soft-reference three conductor magnetic memory 200 in a cross-point architecture. The first sense/write conductor 504 is in electrical contact with the data layer 510, and is substantially transverse to the second sense conductor 506 in electrical contact with the soft-reference layer 514. The third write column conductor 508 is substantially proximate to, and electrically isolated from, the second sense conductor 506. In at least one embodiment the electrical isolation is provided by physical space 516.

In a relaxed state where no current is applied, i.e. the magnitude of the current is substantially about zero, the orientation of M2 of the soft-reference layer 514 will be anti-parallel to the orientation M1 of the data layer 510. This is due to the principles of magnetic coupling. Simply stated, the North pole of a magnet is attracted to the South pole of another magnet, and vice versa.

As the soft-reference layer 514 has no fixed orientation, when no other magnetic fields are present and over-riding, it will align itself to be opposite to the data layer 510, thus providing its North pole to the data layer 510 South pole, and its South pole to the data layer 510 North Pole. This anti-parallel relaxed state orientation is unaffected by the SVM cell 502 being placed in proximity to other SVM cells, as for example in a cross-pint array.

Figure 5A:
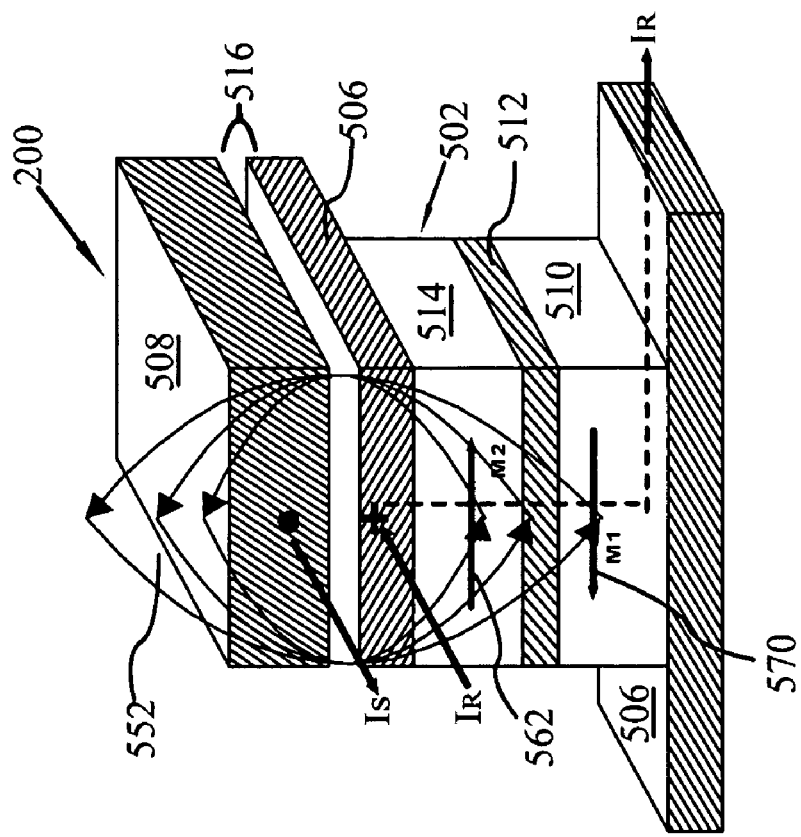
FIGS. 5A and 5B show partial perspective views of the memory of FIG. 2A with respect to the generated sense magnetic fields.
Figure 5B:
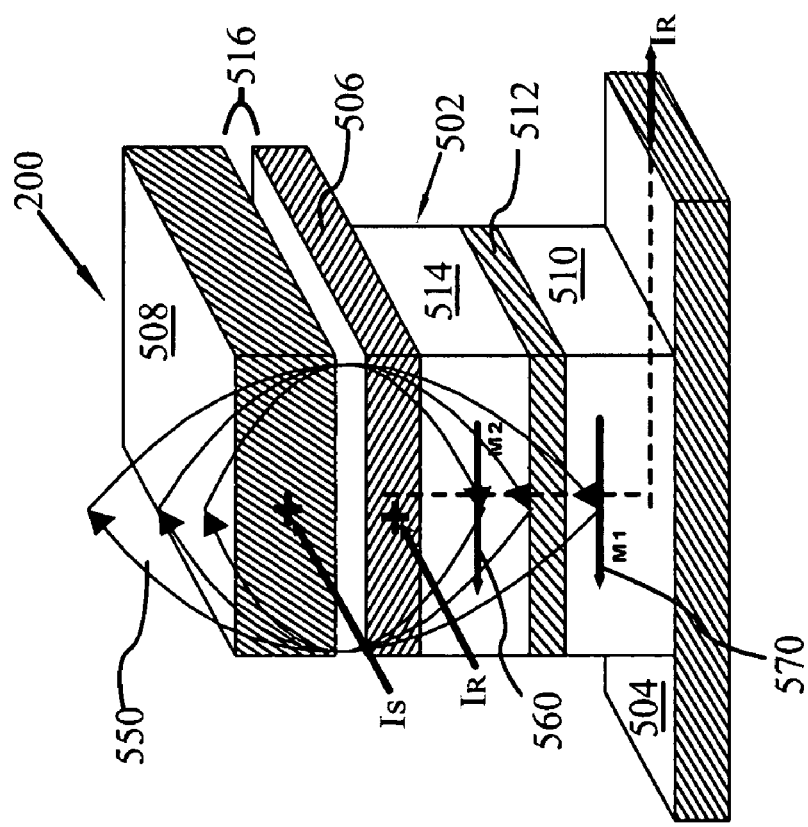

With an SVM cell selected within the cross-point array, an initial sense current is provided. This initial sense current, and subsequent current may be provided and controlled by appropriate control logic, not shown. The initial sense current may be described as having at least two components—$I_S$ which serves to generate the magnetic field and orient the soft-reference layer (blocks 702 and 704), and $I_R$ which passes through the SVM cell 502 and permits the measurement of resistance, blocks 706 and 708. As shown in FIGS. 5A and 5B, the $I_S$ component is applied through the third write column conductor 508 and the $I_R$ component is applied through the first sense/write conductor 504 and second sense conductor 506.

The separation of components into two distinct sense currents is, in at least one embodiment, advantageous. As the $I_S$ component may be driven by a much larger voltage potential, the separation permits the first sense/write conductor 504, the second sense conductor 506 and the SVM cell 502 to be fabricated without undue concern for an ability to withstand a large voltage potential. In at least one embodiment, the initial $I_S$ current is substantially low. As such, the $I_R$ component permits the resistance to be measured while M2 is substantially in its relaxed, natural, anti-parallel state with respect to M1.

The resistance of the SVM cell 502 is measured and recorded as "R1" indicated in blocks 708 and 710. The initial $I_S$ current provided may be applied in an arbitrary direction that is not immediately known. The initial $I_S$ current provided may be substantially low, such that its magnitude is effectively zero and it does not orient-on-the-fly the soft-reference layer 514. As such, though an initial resistance level R1 may be obtained, it is generally beneficial to provide a reference for comparison, and a local reference or self reference is preferred. Such a reference value may be advantageously obtained without disrupting the orientation M1 of the data layer 510, simply by applying the $I_S$ current in a Second Known Direction as indicated in block 712.

As indicated in blocks 712 through 718 the resistance value from the Second Known Direction (the second resistance, R2) is measured and recorded as a reference resistance. More specifically, as indicated in block 712 a second sense current $I_S$ is provided to the third write column conductor flowing in a known direction. In at least one embodiment this known direction is opposite to the current flow of the initial $I_S$ current.

As shown in FIG. 5A the sense current $I_S$ is flowing into the page, indicated by the "+" symbol, such that the magnetic field (represented by curved arrows 550) has a vector in the clockwise direction in accordance with the right-hand rule. The orientation of M2 of soft-reference layer 514 is therefore oriented-on-the-fly towards the left. The magnetic field 550 is by design quite small (within the asteroid 454 of FIG. 4B), and insufficient to affect the orientation of M1 of the data layer 510.

Substantially contemporaneously with the generation of the magnetic field in the known direction, a second sense current $I_R2$ is applied to the first sense/write conductor and second sense conductor so as to permit the current $I_R2$ to flow through SVM cell 502. In at least one embodiment $I_R2$ is substantially identical to $I_R$. The resistance, R2 of the current $I_R2$ is measured and recorded, blocks 716 and 718.

With a reference resistance now known, the initial resistance may be compared. As illustrated in decision block 720, if the initial resistance is different from the reference resistance (R1>R2), a first logic level associated with this first state is returned, block 722. If the initial resistance is not different (R1=R2), then a second logic level associated with this second state is returned, block 724.

This method advantageously permits the determination of the orientation of M1 within the data layer 510 in a non-destructive manner. In addition, there is advantageously no need to perform a write-back operation to reset the initial condition of M1, as it has not been changed. Eliminating a potential operation permits the soft-reference three conductor magnetic memory 200 to operate more quickly in situations that would otherwise require a write-back operation.

Under appropriate circumstances, a slightly different approach to sensing the data value may be taken. Briefly stated, the soft-reference layer is pinned-on-the-fly in two known directions, with the resistance being measured for each. The measured resistance values are then compared to determine the orientation of M1 in the data layer.

For example, and with respect to FIGS. 5A and 5B, an initial current $I_S$ is applied in a First Known Direction to the third write column conductor 508. As shown in FIG. 5A, the sense current $I_S$ is flowing into the page, indicated by the "+" symbol, such that the magnetic field 550 has a vector in the clockwise direction in accordance with the right-hand rule. The orientation of M2 560 of the soft-reference layer 514 is therefore oriented-on-the-fly towards the left. The magnetic field 550 is by design small, and insufficient to affect the orientation of M1 570 of the data layer 510.

As the third write column conductor 508 is electrically isolated from the SVM cell 502 by intention, a separate initial current $I_R$ is applied to the second sense conductor 506 to flow through the SVM cell 502 to first sense/write conductor 504. The resistance from the First Known Sense Current (the first resistance, R1) is then measured and recorded as a reference resistance.

As shown in FIG. 5B, a current $I_S$ is then applied to the third write column conductor 508 in a Second Known Direction. As shown in FIG. 5B, the sense current $I_S$ is flowing out of the page, indicated by the "·" symbol, such that the magnetic field (represented by curved arrows 552) has a vector in the counter-clockwise direction in accordance with the right-hand rule. The orientation of M2 562 of the soft-reference layer 514 is therefore oriented-on-the-fly towards the right. As before the magnetic field 552 is quite small and insufficient to affect the orientation of M1 570 of the data layer 510.

The resistance of the Second Known Current $I_S$ (the second resistance, R2) is measured and recorded. With R2 now known, the values of R1 and R2 may be compared, decision 720. If the initial resistance is greater than the second resistance (R1>R2), a first logic level associated with this first state is returned, block 722. If the initial resistance is less than the second resistance (R1<R2), then a second logic level associated with this second state is returned, block 724.

Under appropriate circumstances, this separate initial current $I_R$ may be applied to flow from the first sense/write conductor 504 through the SVM cell 502 to the second sense conductor 506. Moreover, in at least one embodiment, for the sensing of resistance within the SVM cell, the direction of the current $I_R$ is substantially immaterial.

For either method, it is appreciated that where R1 is greater than R2, a first logic level associated with the first state is returned. As a result, under appropriate circumstances the method may be simplified to test for this condition, R1>R2. Further, in at least one embodiment, the measurement of current flow through the SVM cell 502 for the determination of resistance is made according to an integration of time.

Figures 6A, 6B:
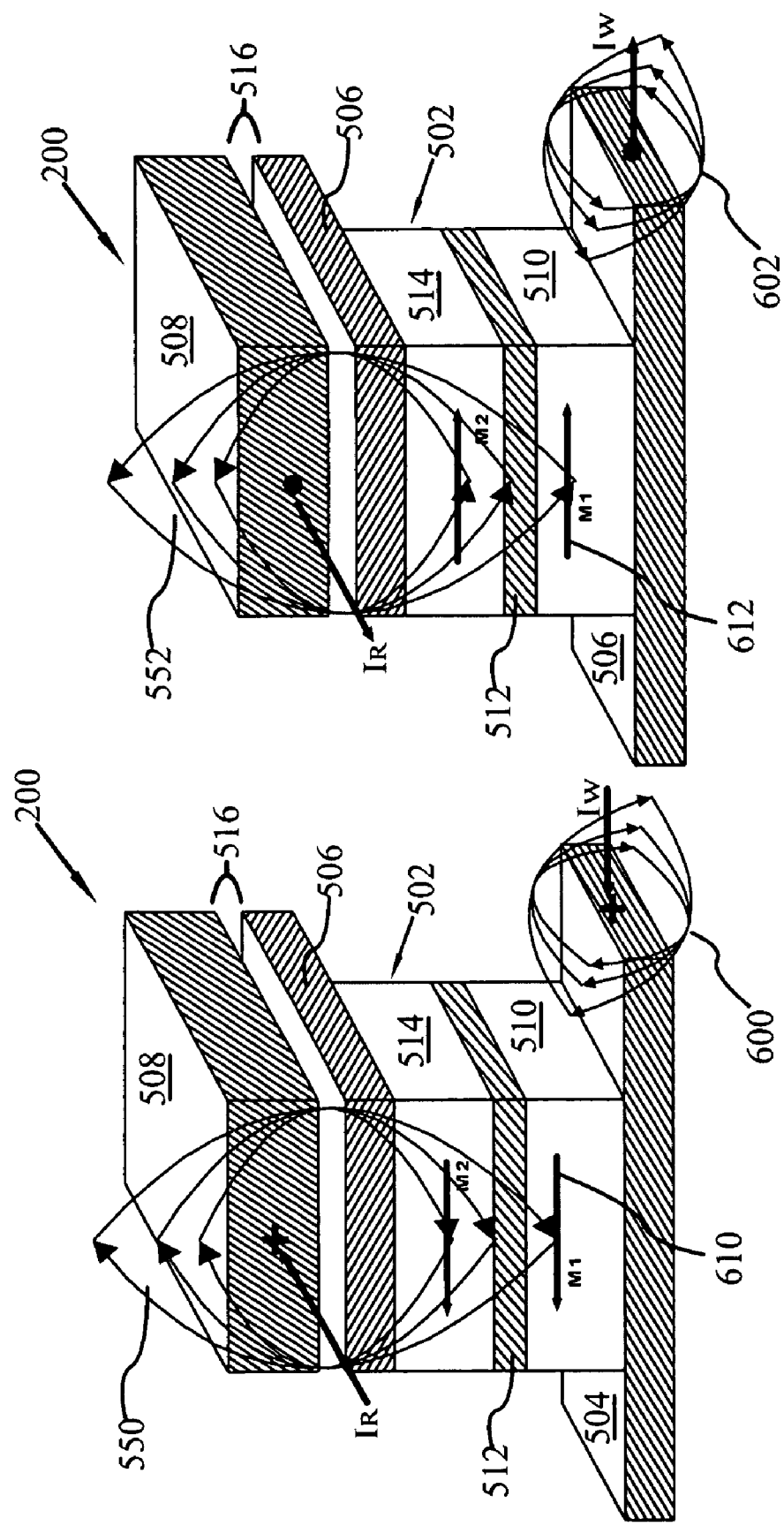
FIGS. 6A and 6B show partial perspective views of the memory of FIG. 2A with respect to the generated write magnetic fields.

The inadvertent re-orientation of unselected SVM cells is advantageously reduced in write operations. As shown in FIGS. 6A and 6B, the reorientation of a selected data layer 510, will occur when and if the magnetic field 550 of the third write column conductor 508, is combined with the magnetic field of the first sense/write conductor 504, (represented as arrows 600 and 602). The magnetic field 600, 602 is provided when an appropriate current $I_W$ is provided through the first sense/write conductor 504.

Shown in FIG. 6A, the fields 550 and 600 combine to align M1 610 of the data layer 510 towards the left. Shown in FIG. 6B, the fields 552 and 602 will combine at to align M1 612 of the data layer 510 towards the right. In either case, the fields combine at the selected SVM cell 502, permitting the reorientation of the selected SVM cell 502 while reducing the likelihood of inadvertently switching unselected SVM cells. The orientation of the soft-reference layer 514 is of little concern, for the orientation of M2 will return to a relaxed state (anti-parallel with respect to M1) once the magnetic fields are removed.

It is understood and appreciated that a convention will be adopted such as, for example, a logic state of "1" exists where M1 and M2 are anti-parallel (high resistance) in a first state, and a logic state of "0" exists where M1 and M2 are parallel (low resistance) in a second state. It is important to note that the sensing of the initial resistance (the first resistance) may be performed repeatedly, and averaged. So too may the sensing of the second resistance be performed repeatedly, as it is well known and appreciated that with greater sampling there is a reduction in arbitrary error.

As the orientation of M2 560, 562 of the soft-reference layer 514 is being altered in the sense process and not the orientation of M1 570 of the data layer 510, a disruption/corruption of the data layer 510 during the read/sense process is substantially unlikely as the data layer 510 is not subjected to any write or re-write operation as is common in the prior art. This non-disruptive sensing ability is most advantageous.

Another embodiment may be appreciated to be a computer system incorporating the soft-reference three conductor magnetic memory 200. A computer with a main board, CPU and at least one memory store comprised of an embodiment of the soft-reference three-conductor magnetic memory 200 as described above raises the advantages of the improved SVM cells to a system level.

Changes may be made in the above methods, systems and structures without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method, system and structure, which, as a matter of language, might be said to fall there between.

We claim:

1. A soft-reference three conductor magnetic memory storage device comprising:
    an electrically conductive first sense/write conductor;
    an electrically conductive second sense conductor;
    a soft-reference spin valve memory (SVM) cell in electrical contact with and located between the first sense/write conductor and the second sense conductor, the SVM cell comprising a material with an alterable orientation of magnetization; and an electrically conductive third write column substantially proximate to and electrically isolated from the second sense conductor;

wherein each SVM cell includes:

at least one ferromagnetic data layer characterized by an alterable orientation of magnetization;

an intermediate layer in contact with the at least one ferromagnetic data layer; and at least one ferromagnetic soft-reference layer in contact with the intermediate layer, opposite from the at least one ferromagnetic data layer, the at least one ferromagnetic soft-reference layer having a non-pinned orientation of magnetization and lower coercivity than the at least one ferromagnetic data layer, wherein the SVM cell is operable during a read operation such that the at least one ferromagnetic soft-reference layer is oriented-on-the-fly to a desired orientation by a sense magnetic field generated by at least one sense current flowing in the third write column conductor, the magnetic field being insufficient to affect the orientation of the at least one ferromagnetic data layer of the SVM cell, and wherein the SVM cell is operable during a write operation such that the combined write magnetic field generated by a write current flowing in the first sense/write conductor and a write current flowing in the third write column conductor, the combined magnetic field sufficient to orient the at least one ferromagnetic data layer.

2. A soft-reference three conductor magnetic memory storage device comprising:

an electrically conductive first sense/write conductor;

an electrically conductive second sense conductor;

a soft-reference spin valve memory (SVM) cell in electrical contact with and located between the first sense/write conductor and the second sense conductor, the SVM cell comprising a material with an alterable orientation of magnetization;

and an electrically conductive third write column substantially proximate to and electrically isolated from the second sense conductor;

wherein each SVM cell includes:

at least one ferromagnetic data layer characterized by an alterable orientation of magnetization;

an intermediate layer in contact with the at least one ferromagnetic data layer;

and at least one ferromagnetic soft-reference layer in contact with the intermediate layer, opposite from the at least one ferromagnetic data layer, the at least one ferromagnetic soft-reference layer having a non-pinned orientation of magnetization and lower coercivity than the at least one ferromagnetic data layer, wherein the at least one ferromagnetic data layer and the at least one ferromagnetic soft-reference layer are each further characterized as having a hard axis and an easy axis, the easy axis of the data layer being substantially parallel to the easy axis of the at least one ferromagnetic soft-reference layer, and the third write column conductor being substantially transverse to the easy axis of the at least one ferromagnetic data layer and the at least one ferromagnetic soft-reference layer.

3. A soft-reference three conductor magnetic storage device comprising:

a plurality of parallel electrically conductive first sense/write conductors;

a plurality of parallel electrically conductive second sense conductors crossing the first conductors, each thereby forming a cross-point array with a plurality of intersections;

a plurality of soft-reference spin valve memory (SVM) cells, each cell in electrical contact with and located at an intersection between a first sense/write conductor and a second sense conductor, the memory cells comprising a material with an alterable orientation of magnetization, and wherein each SVM memory cell includes at least one ferromagnetic data layer characterized by an alterable orientation of magnetization, an intermediate layer in contact with the data layer, and at least one ferromagnetic soft-reference layer in contact with the intermediate layer, opposite from the data layer, the soft-reference layer having a non-pinned orientation of magnetization and lower coercivity than the data layer; and a plurality of parallel electrically conductive third write column conductors substantially proximate to and electrically isolated from the second sense conductors, wherein the SVM cell is operable during a read operation such that the at least one ferromagnetic soft-reference layer of the given cell is oriented-on-the-fly to a desired orientation by a sense magnetic field generated by at least one sense current flowing in at least one third write column conductor crossing the selected cell, the magnetic field being insufficient to affect the orientation of the at least one ferromagnetic data layer of the selected SVM cell, and wherein the SVM cell is operable during a write operation such that the combined write magnetic field generated by a write current flowing in a first sense/write conductor contacting the selected cell and a write current flowing in a third write column conductor crossing the selected cell, the combined magnetic field sufficient to orient the at least one ferromagnetic data layer.

4. The magnetic memory device of claim 3, wherein the third write column conductors are electrically isolated from the second sense conductors by physical space.

5. The magnetic memory device of claim 3, wherein the third write column conductors are electrically isolated from the second sense conductors by a dielectric therebetween.

6. The magnetic memory device of claim 3, wherein the third write column conductors are substantially parallel to the second sense conductors.

7. The magnetic memory device of claim 3, wherein the third write column conductors are substantially surrounded by a ferromagnetic cladding.

8. The magnetic memory device of claim 3, wherein the first sense/write conductors are substantially surrounded by a ferromagnetic cladding.

9. A soft-reference three conductor magnetic storage device comprising:

a plurality of parallel electrically conductive first sense/write conductors;

a plurality of parallel electrically conductive second sense conductors crossing the first conductors, each thereby forming a cross-point array with a plurality of intersections;

a plurality of soft-reference spin valve memory (SVM) cells, each cell in electrical contact with and located at an intersection between a first sense/write conductor and a second sense conductor, the memory cells comprising a material with an alterable orientation of magnetization, and wherein each SVM memory cell includes at least one ferromagnetic data layer characterized by an alterable orientation of magnetization, an intermediate layer in contact with the data layer, and at least one ferromagnetic soft-reference layer in contact with the intermediate layer, opposite from the data layer, the soft-reference layer having a non-pinned orientation of magnetization and lower coercivity than the data layer; and a plurality of parallel electrically conductive third write column conductors substantially proximate to and electrically isolated from the second sense conductors, wherein the at least one ferromagnetic data layer and the at least one ferromagnetic soft-reference layer are each further characterized as having a hard axis and an easy axis, the easy axis of the data layer being substantially parallel to the easy axis of the at least one ferromagnetic soft-reference layer, and the third write column conductor being substantially transverse to the easy axis of the at least one ferromagnetic data layer and the at least one ferromagnetic soft-reference layer.

10. A soft-reference three conductor magnetic memory (SVM) cell comprising:

at least one ferromagnetic data layer characterized by an alterable orientation of magnetization;

an intermediate layer in contact with the data layer;

at least one ferromagnetic soft-reference layer in contact with the intermediate layer, opposite from the data layer, the soft-reference layer having a non-pinned orientation of magnetization and lower coercivity than the data layer;

at least one first sense/write conductor in electrical contact with the data layer, opposite from the intermediate layer;

at least one second sense conductor in electrical contact with the soft-reference layer, opposite from the intermediate layer; and at least one third write column conductor substantially proximate to and electrically isolated from the second sense conductor, wherein the SVM cell is operable during a read operation such that the at least one ferromagnetic soft-reference layer of the selected cell is oriented-on-the-fly to a desired orientation by a sense magnetic field generated by at least one sense current flowing in at least one third write column conductor crossing the selected cell, the magnetic field being insufficient to affect the orientation of the at least one ferromagnetic data layer of the selected SVM cell; and wherein the SVM cell is operable during a write operation such that the combined write magnetic field generated by a write current flowing in a first sense/write conductor contacting the selected cell SVM and a write current flowing in a third write column conductor crossing the selected SVM cell, the combined magnetic field sufficient to orient the at least one ferromagnetic data layer.

11. A soft-reference three conductor magnetic memory (SVM) cell comprising:

at least one ferromagnetic data layer characterized by an alterable orientation of magnetization;

an intermediate layer in contact with the data layer;

at least one ferromagnetic soft-reference layer in contact with the intermediate layer, opposite from the data layer, the soft-reference layer having a non-pinned orientation of magnetization and lower coercivity than the data layer;

at least one first sense/write conductor in electrical contact with the data layer, opposite from the intermediate layer;

at least one second sense conductor in electrical contact with the soft-reference layer, opposite from the intermediate layer; and at least one third write column conductor substantially proximate to and electrically isolated from the second sense conductor, wherein the first conductor is substantially transverse to the second conductor.

12. A soft-reference three conductor magnetic memory (SVM) cell comprising:

at least one ferromagnetic data layer characterized by an alterable orientation of magnetization;

an intermediate layer in contact with the data layer;

at least one ferromagnetic soft-reference layer in contact with the intermediate layer, opposite from the data layer, the soft-reference layer having a non-pinned orientation of magnetization and lower coercivity than the data layer;

at least one first sense/write conductor in electrical contact with the data layer, opposite from the intermediate layer;

at least one second sense conductor in electrical contact with the soft-reference layer, opposite from the intermediate layer; and at least one third write column conductor substantially proximate to and electrically isolated from the second sense conductor, wherein the at least one ferromagnetic data layer and the at least one ferromagnetic soft-reference layer are each further characterized as having a hard axis and an easy axis, the easy axis of the at least one ferromagnetic data layer being substantially parallel to the easy axis of the at least one ferromagnetic soft-reference layer, and the third write column conductor being substantially transverse to the easy axis of the at least one ferromagnetic data layer and the at least one ferromagnetic soft-reference layer.

13. A method of self referenced non-destructively determining a data value in a magnetic memory storage device having a plurality of soft-reference layer three conductor SVM cells, each cell including at least one data layer and at least one soft-reference layer, the method including:

selecting a given SVM cell in electrical contact with a given first sense/write conductor, a given second sense conductor, and substantially proximate to and electrically isolated from a third write column conductor;

providing an initial field current to the third write column conductor; the initial current generating an initial sense magnetic field proximate to the given SVM cell;

orienting-on-the-fly the at least one soft-reference layer of the given SVM cell in orientation with the initial sense magnetic field;

providing an initial sense current by the given first sense/write conductor and second sense conductor through the given SVM cell;

measuring an initial resistance value of the given SVM cell;

storing the initial resistance value;

providing a second known field current to the third write column conductor, the second known current generating an second known sense magnetic field orienting the at least one soft-reference layer in a second known orientation;

providing a second sense current by the given first sense/write conductor and second sense conductor through the given SVM cell;

storing the second resistance value as a reference resistance;

comparing the initial resistance value to the reference resistance value; and returning a logic level associated with the compared state.

14. The method of claim 13, wherein the sense magnetic fields do not affect the at least one data layer.

15. The method of claim 13, wherein the second known field current flows in an opposite direction to the initial field current.

16. The method of claim 13, wherein the magnitude of the initial field current is substantially about zero.

17. The method of claim 13, wherein the initial resistance value is measured when the orientation of the at least one soft-reference layer is anti-parallel to the at least one data layer.

18. The method of claim 13, wherein the method is repeated more than once.

19. The method of claim 13, wherein the at least one soft-reference layer is characterized as having a hard axis and an easy axis, the initial and second magnetic fields being in line with the easy axis.

20. A computer system comprising:

a main board;

at least one central processing unit (CPU) coupled to the main board;

at least one memory store joined to the CPU by the main board, the memory store including:

a plurality of parallel electrically conductive first sense/write conductors;

a plurality of parallel electrically conductive second sense conductors crossing the first conductors, each thereby forming a cross-point array with a plurality of intersections;

a plurality of soft-reference SVM cells, each cell in electrical contact with and located at an intersection between a first conductor and a second conductor, the memory cells including;

at least one ferromagnetic data layer characterized by an alterable orientation of magnetization;

an intermediate layer in contact with the at least one ferromagnetic data layer;

at least one ferromagnetic soft-reference layer in contact with the intermediate layer, opposite from the data layer, the at least one ferromagnetic soft-reference layer having a non-pinned orientation of magnetization and lower coercivity than the at least one ferromagnetic data layer; and a plurality of parallel electrically conductive third write column conductors substantially proximate to and electrically isolated from the second sense conductors, wherein the SVM cell is operable during a read operation such that the at least one ferromagnetic soft-reference layer of the selected SVM cell is oriented-on-the-fly to a desired orientation by a sense magnetic field generated by at least one sense current flowing in at least one third write column conductor crossing the selected SVM cell, the magnetic field being insufficient to affect the orientation of the at least one ferromagnetic data layer of the selected cell; and wherein the SVM cell is operable during a write operation such that the combined write magnetic field generated by a write current flowing in a first sense/write conductor contacting the selected SVM cell and a write current flowing in a third write column conductor crossing the selected SVM cell, the combined magnetic field sufficient to orient the at least one ferromagnetic data layer.

* * * * *